United States Patent
Tan et al.

(10) Patent No.: US 11,393,921 B2
(45) Date of Patent: Jul. 19, 2022

(54) HIGH-VOLTAGE SEMICONDUCTOR DEVICE

(71) Applicant: Vanguard International Semiconductor Corporation, Hsinchu (TW)

(72) Inventors: Hung-Chih Tan, Kaohsiung (TW); Hsing-Chao Liu, Hsinchu County (TW); Hsiao-Ying Yang, Hsinchu (TW); Chih-Cherng Liao, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 50 days.

(21) Appl. No.: 17/002,785

(22) Filed: Aug. 26, 2020

(65) Prior Publication Data
US 2022/0069122 A1    Mar. 3, 2022

(51) Int. Cl.
*H01L 29/06* (2006.01)
*H01L 29/10* (2006.01)
*H01L 29/78* (2006.01)

(52) U.S. Cl.
CPC ...... *H01L 29/7816* (2013.01); *H01L 29/0615* (2013.01); *H01L 29/1095* (2013.01)

(58) Field of Classification Search
USPC ........................................ 257/339
See application file for complete search history.

(56) References Cited

U.S. PATENT DOCUMENTS

| 9,997,625 B2 * | 6/2018 | Furuhata ............. H01L 29/0878 |
| 2007/0278568 A1 * | 12/2007 | Williams .......... H01L 29/66106 257/335 |
| 2013/0207183 A1 | 8/2013 | Kao |
| 2013/0265086 A1 | 10/2013 | Chang |
| 2016/0079344 A1 * | 3/2016 | Agam ................. H01L 29/7816 257/493 |

* cited by examiner

*Primary Examiner* — Fazli Erdem
(74) *Attorney, Agent, or Firm* — Winston Hsu (57) ABSTRACT

A high-voltage semiconductor device includes a substrate, a first insulating structure, a gate, a drain region, a source region and a doped region. The substrate has a first conductive type, and the first insulating structure is disposed on the substrate. The drain region and the source region are disposed in the substrate. The source region has a first portion and a second portion. The first portion has the second conductive type and the second portion has the first conductive type. The gate is disposed on the substrate, between the source region and the drain region to partially cover a side of the first insulating structure. The doped region is disposed in the substrate and has a first doped region and a second doped region, and the first doped region and the second doped region both include the first conductive type and separately disposed under the first insulating structure.

17 Claims, 6 Drawing Sheets

HIGH-VOLTAGE SEMICONDUCTOR DEVICE

BACKGROUND OF THE INVENTION

1. Field of the Invention

The present disclosure relates to a semiconductor device, and more particularly, to a high-voltage semiconductor device.

2. Description of the Prior Art

With improvement in semiconductor manufacturing, it is conceivable to fabricate control circuits, memories, low-voltage circuits, high-voltage circuits, and the related devices in a single chip for reducing costs and improving performance. And a MOS transistor device, which is widely applied for enlarging currents or signals in a circuit, serving as an oscillator of a circuit, or serving as a switch device of a circuit, is further applied to be the high power device or the high-voltage device based on the development of semiconductor processes. For example, a MOS transistor device, serving as a high-voltage device, is applied in between the internal circuits and the I/O terminals for preventing a large number of charges from suddenly spiking into the internal circuits and thus to avoid the resulted damage to the internal circuit.

In the current transistor which is applied on high-voltage device, the breakdown voltage thereof is increased mainly by reducing the lateral electric field of the high-voltage device. Thus, the structure of the high-voltage device generally includes a double diffused drain metal oxide semiconductor (DDDMOS), a laterally diffused MOS (LDMOS) or the like. However, there is still a need to further increase the breakdown voltage of the high-voltage semiconductor device, in order to meet the practical requirements in the industry.

SUMMARY OF THE INVENTION

It is one of the primary objectives of the present disclosure to provide a high-voltage semiconductor device, in which, at least one concentration modulated region is additionally disposed in a portion of an insulating buried layer under the drain region. The at least one concentration modulated region includes the same conductive type as that of the insulating buried layer, the same dopant as that of the insulating buried layer and relative lower doped concentration than that of the insulating buried layer. Thus, the at least one concentration modulated enables to effectively reduce the electric field intensity under the drain region, and therefore to improve the breakdown voltage of the high-voltage semiconductor device.

A preferable embodiment of the present disclosure provides a high-voltage semiconductor device including a substrate, a buried layer, a drain region, a source region, a gate and at least one concentration modulated region. The substrate includes a first conductive type, and the buried layer is disposed in the substrate to include a second conductive type which is complementary to the first conductive type. The source region is disposed in the substrate and over the buried layer, and the source region includes the first conductive type. The drain region is disposed in the substrate and over the buried layer, and the drain region includes the first conductive type. The gate is disposed on the substrate, between the source region and the drain region. The at least one concentration modulated region is disposed in a portion of the buried layer. The at least one concentration modulated region is under the drain region and includes the second conductive type, with a doped concentration of the at least one concentration modulated region being less than a doped concentration of the buried layer.

These and other objectives of the present invention will no doubt become obvious to those of ordinary skill in the art after reading the following detailed description of the preferred embodiment that is illustrated in the various figures and drawings.

DETAILED DESCRIPTION

For better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

In the present disclosure, the formation of a first feature over or on a second feature in the description may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Furthermore, spatially relative terms, such as "beneath," "below," "lower," "over," "above," "upper" and the like, may be used herein for ease of description to describe one element or feature's relationship to another element (s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, preferably within 10%, and more preferably within 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Figure 1:
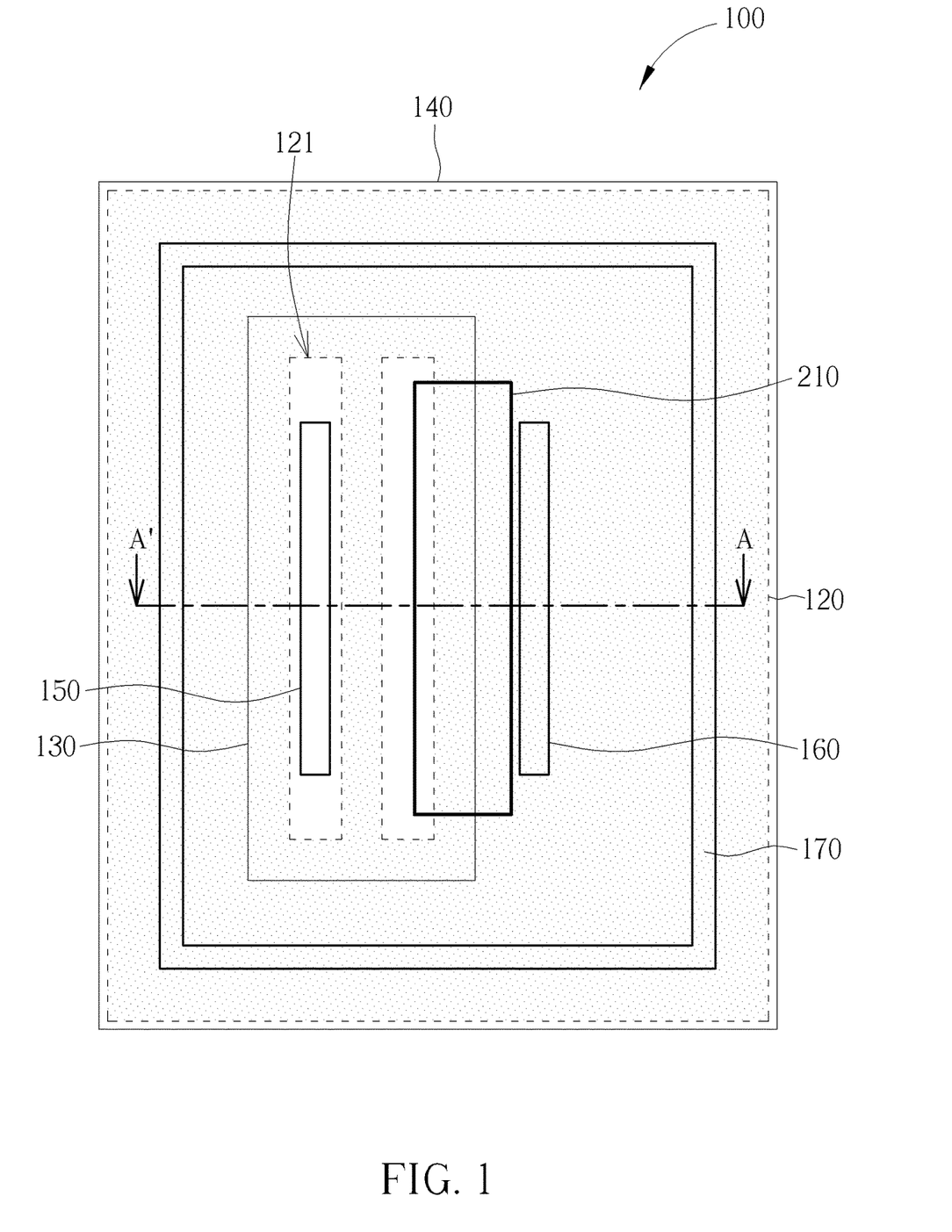
FIG. 1 is a schematic diagram illustrating a top view of a high-voltage semiconductor device according to a first embodiment of the present disclosure.
Figure 2:
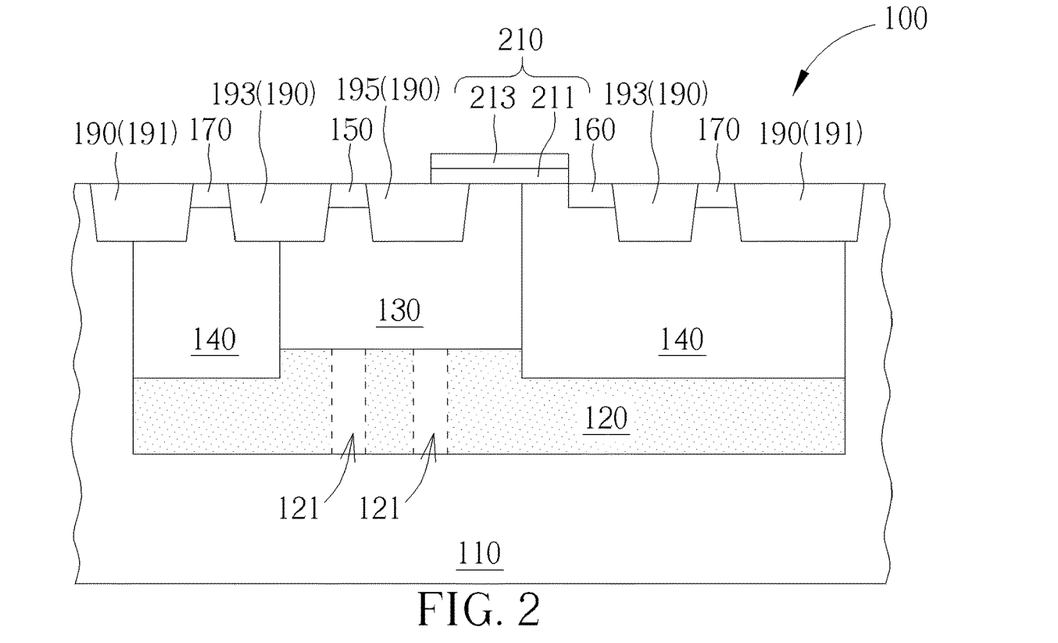
FIG. 2 shows a cross-sectional view taken along a cross line A-A' in FIG. 1.

Please refers to FIG. 1 and FIG. 2, which illustrate a high-voltage semiconductor device 100 according to the first embodiment of the present disclosure, wherein FIG. 1 shows a top view of the high-voltage semiconductor device 100, and FIG. 2 shows a cross-sectional view of the high-voltage semiconductor device 100. The high-voltage semiconductor device 100 of the present disclosure refers to a semiconductor device having an operating voltage higher than about 90 volts (V), for example it may be a laterally diffused metal oxide semiconductor transistor (LDMOS transistor) such as an N-type LDMOS or a P-type LDMOS. In the present embodiment, the high-voltage semiconductor device 100 is exemplified as a P-type LDMOS, but is not limited thereto.

Firstly, as shown in FIG. 1 and FIG. 2, the high-voltage semiconductor device 100 includes a substrate 110, such as a silicon substrate, an epitaxial silicon substrate, a silicon germanium substrate, a silicon carbide substrate or a silicon-on-insulator (SOI) substrate, and at least one insulating structure 190 disposed on the substrate 110. In the present embodiment, the insulating structure 190 may be a field oxide (FOX) layer which is formed for example through a local oxidation of silicon (LOCOS) process as shown in FIG. 2, but is not limited thereto. In another embodiment, the insulating structure 190 may also be a shallow trench isolation (STI) which is formed through a deposition process, or may be other insulating elements being formed by other suitable processes. It is noted that, in order to clearly show the relationships of certain specific doped regions in the high-voltage semiconductor device 100, the insulating structure 190 is omitted in FIG. 1. However, people well skilled in the arts should easily realize the specific location of the insulating structure 190 through the illustration in FIG. 2. Also, the specific location and the number of the insulating structure 190 in the present disclosure will be described in subsequent paragraphs.

The substrate 110 includes a first conductive type (for example the P-type), and a first well region 130 and a second well region 140 are respectively disposed in the substrate 110. Precisely speaking, the first well region 130 includes the first conductive type (for example the P-type), and a drain region 150 is formed in the first well region 130. The drain region 150 also includes the first conductive type (for example the P-type), and a doped concentration of the drain region 150 is preferably greater than a doped concentration of the first well region 130. The second well region 140 surrounds the outer periphery of the first well region 130, and the second well region 140 includes a second conductive type (for example the N-type). The second conductive type (N-type) is complementary to the first conductive type (P-type). In the present embodiment, a depth of the second well region 140 is greater than a depth of the first well region 130, as shown in FIG. 2, but is not limited thereto. A source region 160 is formed in the second well region 140, and the source region 160 includes the first conductive type (for example the P-type).

Furthermore, a body region 170 is formed in the second well region 140. The body region 170 includes the second conductive type (for example the N-type), and a doped concentration of the body region 170 is preferably greater than a doped concentration of the second well region 140. In one embodiment, the body region 170 preferably not directly contacts the drain region 150 disposed in the first well region 130. For example, an insulating structure 191 and an insulating structure 193 are respectively disposed at two opposite sides of the body region 170, and the insulating structure 193 and an insulating structure 195 are respectively disposed at two opposite sides of the drain region 150. Accordingly, the insulating structure 193 may be sandwiched between the drain region 150 and the body region 170, so that, the drain region 150 and the body region 170 may be electrically isolated from each other, as shown in FIG. 2. In one embodiment, the body region 170 may include a ring shape, for example, in a rectangular frame shape as shown in FIG. 1, so that, the body region 170 may surround the outer periphery of the drain region 150 and the source region 160. However, people well skilled in the art should easily realize that the body region of another embodiment may also include other shapes such as a square shape, a circular shape, a racetrack shape or other suitable shapes, which is not limited to what is shown in FIG. 1. In addition, a gate 210 is disposed on the substrate 110, and the gate 210 includes a gate insulating layer 211 and a gate electrode layer 213 which are stacked sequentially on the substrate 110. The gate electrode layer 213 for include includes a polysilicon layer or a metal layer, but is not limited thereto. The gate 210 is disposed between the source region 160 and the drain region 150. In the present embodiment, one end of the gate 210 partially covers on the second well region 140 disposed in the substrate 110, and the end of the gate 210 adjacent to the source region 160. On the other hand, another end of the gate 210 partially covers on the first well region 130 and the insulating structure 195, without directly contacting the drain region 150.

Furthermore, a buried layer 120 is disposed in the substrate 110, below the first well region 130 and the second well region 140. The buried layer 120 may include the second conductive type (for example the N-type), and a doped concentration of the buried layer 120 may be greater than the doped concentration of the first well region 130 and the second well region 140. In the present embodiment, the buried layer 120 and the second well region 140 within the substrate 110 are both configured as an isolation layer of the high-voltage semiconductor device 100, for avoiding currents directly punching through the bottom substrate 110 or the internal substrate 110 via the first well region 130 to affect the device performance of the high-voltage semiconductor device 100. It is noted that, the high-voltage semiconductor device 100 of the present embodiment further includes at least one concentration modulated region 121 disposed in a portion of the buried layer 120, with the number of the concentration modulated region 121 being single or plural optionally. In the present embodiment, two concentration modulated regions 121 which are separately disposed in a portion of the buried layer 120 are exemplified in the high-voltage semiconductor device 100 of the present embodiment, but is not limited thereto. People well skilled in the art should easily understand that the number of the concentration modulated regions may be further adjusted according to the practical product requirements, for example only disposing a single concentration modulated region or disposing more than two concentration modulated regions in a portion of the buried layer 120.

It is also noted that, the concentration modulated regions 121 are preferably disposed in a portion of the high-voltage semiconductor device 100 where the electric field is stronger, for example being adjacent to the PN junction between the first well region 130 and the second well region 140 or adjacent to the PN junction between the first well region 130 and the buried layer 120, but not limited thereto. For example, the concentration modulated regions 121 are disposed in a portion of the buried layer 120 under the drain region 150 and the first well region 130, and the concentration modulated regions 121 are respectively extended between the top surface and the bottom surface of the buried layer 120 to directly contact the first well 130, as shown in FIG. 2. In a top view as shown in FIG. 1, each of the concentration modulated regions 121 may be illustrated as a stripe-shaped doped region, and a coverage area of the concentration modulated regions 121 is preferably less than a coverage area of the first well region 130, as shown in FIG. 1 and FIG. 2. In a preferable embodiment, a projection area of the concentration modulated regions 121 does not exceed a projection area of the first well region 130 in a direction (not shown in the drawings) which is perpendicular to the substrate 100. In one embodiment, the formation of the concentration modulated regions 121 is for example carried out by additionally disposing a mask (not shown in the drawings) while performing an ion implantation process of the buried layer 120, with the mask blocking a portion of the substrate 110 to prevent the portion of the substrate 110 from being implanted with dopants in the ion implantation process, and making the portion of the substrate 110 only obtaining a small amount of dopants which is diffused from the buried layer 120 during a subsequent drive-in process. Accordingly, the concentration modulated regions 121 may therefore include the same conductive type (such as N-type) as the buried layer 120, the same dopant as the buried layer 120, and a relative lower doped concentration than that of the buried layer 120. For example, the doped concentration of the concentration modulated regions 121 may be about 10% to 20% reduced, preferably about 15% reduced, in comparison with the doped concentration of the buried layer 120, but not limited thereto. In another embodiment, the formation of the concentration modulated regions 121 may be optionally performed either before or after the formation of the buried layer 120. As an example, another ion implantation process may be previously performed at a portion of the substrate 110 to directly form a doped region having a relative lower doped concentration to configure as the concentration modulated region, and then, the buried layer 120 is formed. Otherwise, a predicted portion of the substrate 110 is reserved while forming the buried layer 120 in the substrate 110, and then, another ion implantation process is performed in the predicted portion of the substrate 110 to directly form a doped region having a relative lower doped concentration to configure as the concentration modulated region, but not limited thereto.

Figure 3:
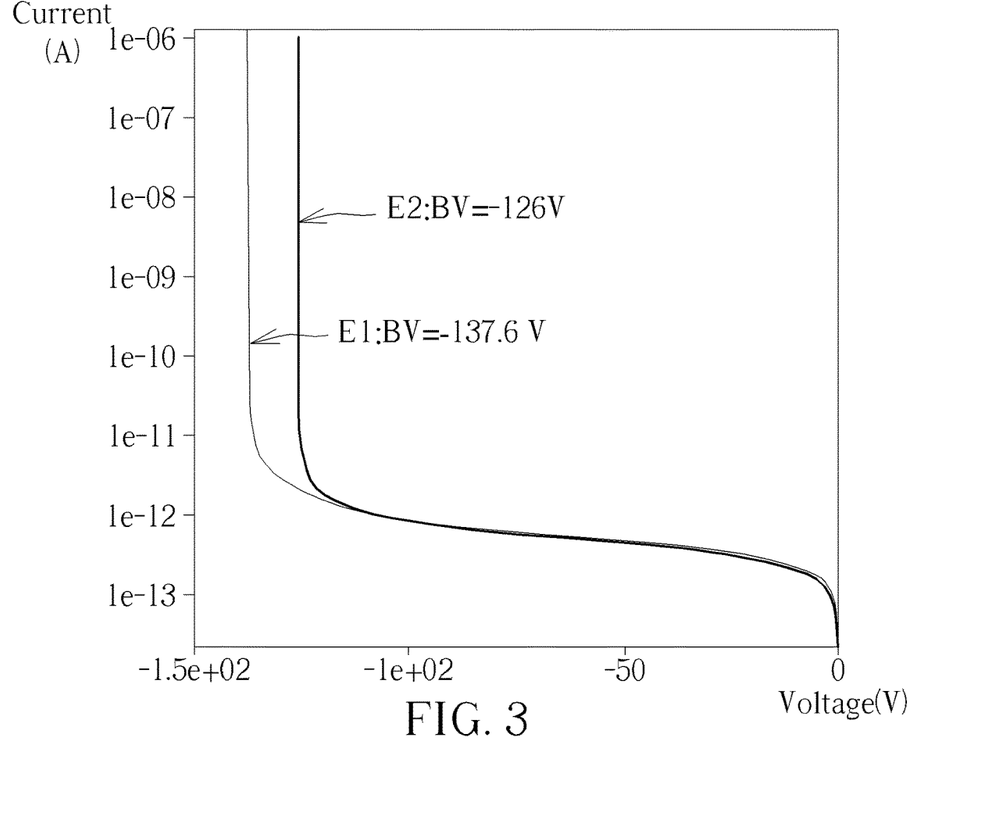
FIG. 3 is a schematic diagram illustrating a simulation result of a high-voltage semiconductor device according to the first embodiment of the present disclosure.

In other words, the concentration modulated regions 121 is namely at least one slot disposed in a portion of the buried layer 120 (for example being disposed in the portion of the buried layer 120 under the drain region 150 and the first well region 130), the slot only gets a small amount of dopants which are diffused from the buried layer 120 during the subsequent drive-in process, so as to have a relative lower doped concentration thereby. Thus, the concentration modulated regions 121 may reduce the electric field intensity of at the portion, thereby improving the lower breakdown voltage issue usually occurred at a portion with stronger electric field intensity in the high-voltage semiconductor device 100 (for example the portion adjacent to the PN junction or adjacent to the drain region 150). With such arrangement, the breakdown voltage of the high-voltage semiconductor device 100 may be increased by about 5 volts, but is not limited thereto. As shown in FIG. 3, the electric field intensity of the high-voltage semiconductor device 100 of the present embodiment (as shown by curve E1) is locally reduced in a simulation test, so that, the high-voltage semiconductor device 100 of the present embodiment may obtain a relative higher breakdown voltage in comparison with a conventional high-voltage semiconductor device (as shown by curve E2), but is not limited thereto. In this way, the high-voltage semiconductor device 100 of the present embodiment may therefore obtain preferable element performances.

People well skilled in the arts should easily realize the high-voltage semiconductor device in the present disclosure is not limited to what is disclosed in the aforementioned embodiment, and may further include other examples or variations to meet practical product requirements. For example, although a P-type LDMOS transistor is exemplified in the aforementioned embodiment, with the first conductive type being the P-type and with the second conductive type being the N-type, but not limited thereto. In another embodiment, the first conductive type may also be the N-type and the second conductive type may also be the P-type to form various type of high-voltage semiconductors. The following description will detail the different embodiments of the high-voltage semiconductor device in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

According to another embodiment of the present disclosure, a high-voltage semiconductor device is provided to appropriately adjust the doped concentration of a portion of the buried layer for locally reducing the electrical field intensity thereof, and also to prevent from the doped concentration of the portion of the buried layer being over reduced to affect the function of the buried layer as the isolation layer. Please refers to FIG. 4, which show a top view of a high-voltage semiconductor device 300 according to the second embodiment of the present disclosure. The structure of the high-voltage semiconductor device 300 of the present embodiment is substantially similar to that of the high-voltage semiconductor device 100 in the aforementioned first embodiment, and which also includes the substrate 110, the first well region 130, the second well region 140, the drain region 150, the source region 160, the body region 170 and the insulating structure 190. All similarities between the present embodiment and the aforementioned embodiment will not be redundantly described hereinafter. The difference between the present embodiment and the aforementioned embodiment is mainly in the specific disposing conditions of concentration modulated regions 321 within a buried layer 321, such as the disposing region, the pattern design, the number, the size and the like of the concentration modulated regions 321.

Figure 4:
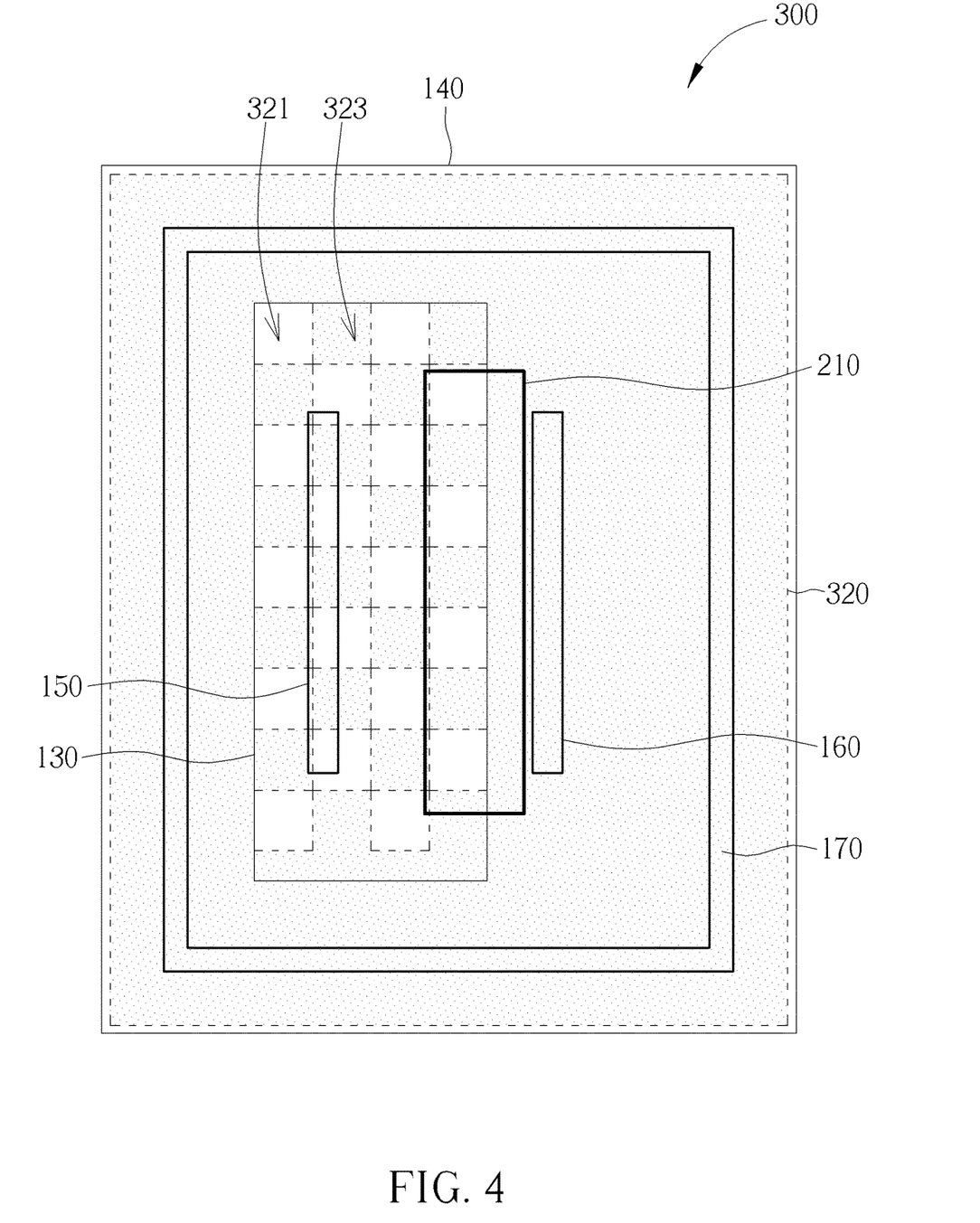
FIG. 4 is a schematic diagram illustrating a high-voltage semiconductor device according to a second embodiment of the present disclosure.

Precisely speaking, a plurality of concentration modulated regions 321 is disposed in a portion of the buried layer 320 in the present embodiment, with the concentration modulated regions 321 being disposed under the drain region 150 and the first well region 130. Also, the concentration modulated regions 321 includes the same conductive type (such as the N-type) as the buried layer 320, the same dopants as the buried layer 320, and a relative lower doped concentration than that of the buried layer 320. It is noted that, the concentration modulated regions 321 of the present embodiment for example includes at least one square-shaped doped region, and each of the square-shaped doped regions is spaced from each other to misalign with each other in a top view as shown in FIG. 4. The concentration modulated regions 321 may therefore present a checkerboard arrangement in an overall manner, but not limited thereto. In other words, another portion of the buried layer 320 in the present embodiment (namely, the another portion of the buried layer 320 under the first well region 130) may also form a plurality of square-shaped doped regions 323, with each of the square-shaped doped region 323 spaced from each other to misalign with each other by the concentration modulated regions 321, as shown in FIG. 4.

Through these arrangement, the concentration modulated regions 121 of the present embodiment may be further uniformly arranged in the portion with stronger electric field of the high-voltage semiconductor device 300, so that, the doped concentration of the buried layer 320 under the said portion with stronger electric field may be uniformly reduced, for example being about 10% to 20% reduced, preferably about 15% reduced, in comparison with the doped concentration of other portions of the buried layer 320, but not limited thereto. In this way, the high-voltage semiconductor device 300 of the present embodiment also improves the lower breakdown voltage issue usually occurred at a portion with stronger electric field intensity therein (for example the portion adjacent to the PN junction or adjacent to the drain region 150), to sufficiently increase the breakdown voltage of the said portion with stronger electric field intensity, for example being about 5 volts increased, but is not limited thereto. Then, the high-voltage semiconductor device 300 of the present embodiment may therefore obtain preferable element performances.

Furthermore, people well skilled in the arts should easily realize that the disposing number and pattern (such as stripe-shaped or square-shaped) of the concentration modulated regions 321, 121 in the aforementioned embodiments are only for example, and the practical arrangement thereof is not limited thereto. In another embodiment, the concentration modulated regions may also include other arrangements according to practical requirements, so that, the doped concentration of the buried layer may be locally reduced in a more uniform manner to reduce the electric field intensity. In addition, the overall area occupied by the concentration modulated regions with in the buried layer may also be adjusted based on the practical requirements, and preferably, the breakdown voltage of the high-voltage semiconductor device is increased as much as possible without affecting the isolation function of the buried layer.

Figure 5:
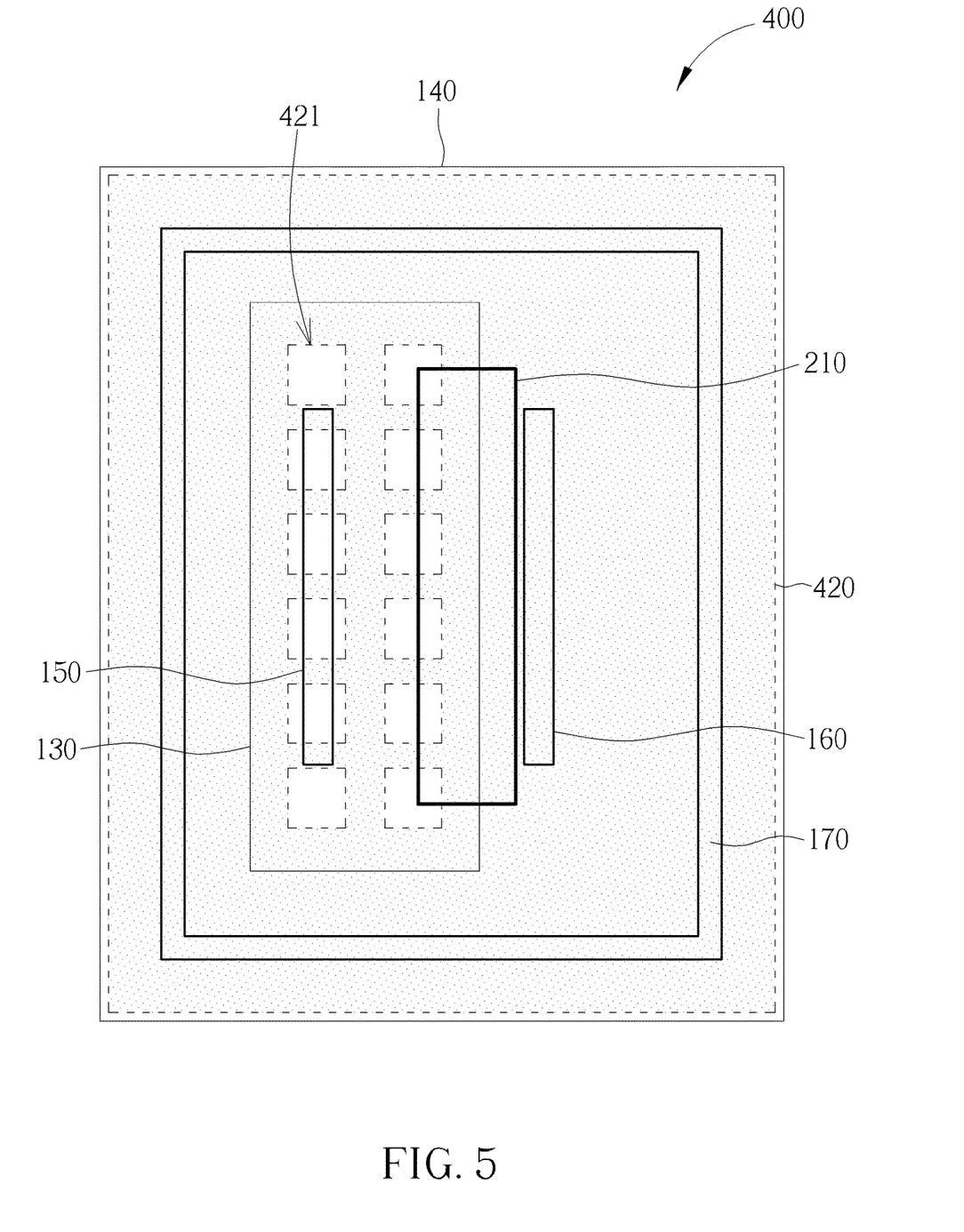
FIG. 5 is a schematic diagram illustrating a high-voltage semiconductor device according to a third embodiment of the present disclosure.
Figure 6:
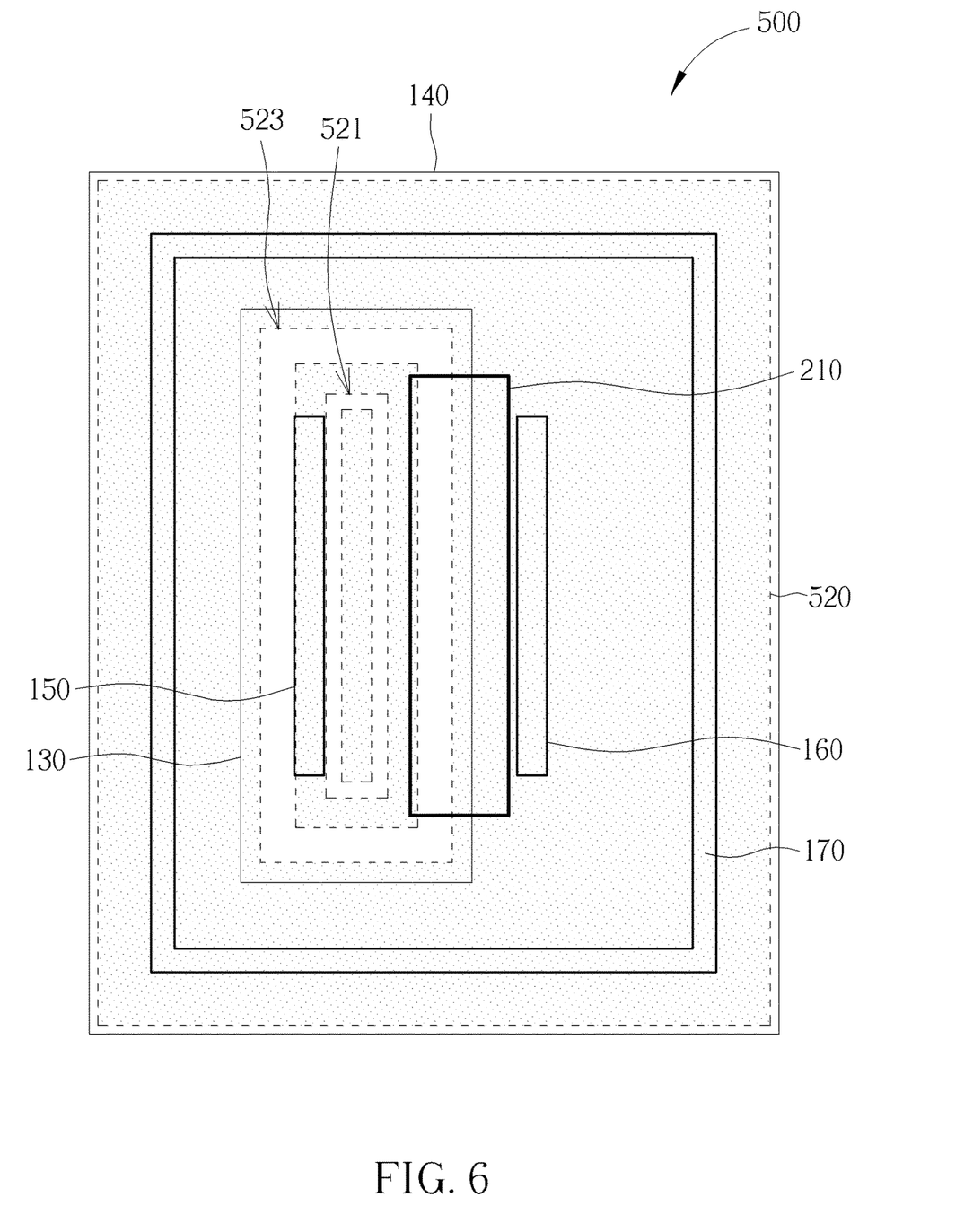
FIG. 6 is a schematic diagram illustrating a high-voltage semiconductor device according to a fourth embodiment of the present disclosure.
Figure 7:
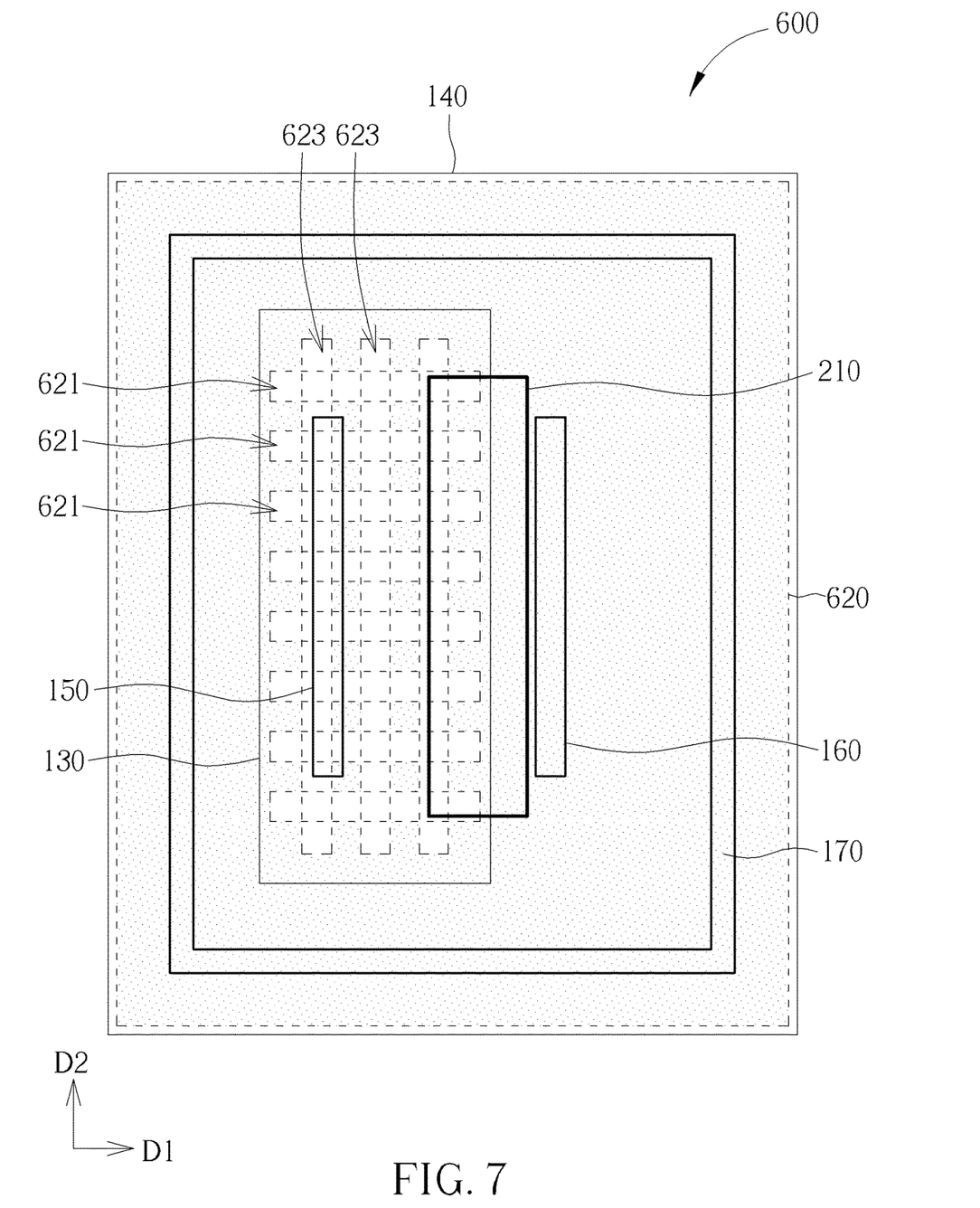
FIG. 7 is a schematic diagram illustrating a high-voltage semiconductor device according to a fifth embodiment of the present disclosure.

Please refer to FIG. 5 to FIG. 7, which show a top view of a high-voltage semiconductor device 400, a high-voltage semiconductor device 500 and a high-voltage semiconductor device 600 according to the third embodiment, the fourth embodiment, and the fifth embodiment of the present disclosure, respectively.

The structure of the high-voltage semiconductor device 400, the high-voltage semiconductor device 500 or the high-voltage semiconductor device 600 is substantially similar to that of the high-voltage semiconductor device 300 in the aforementioned second embodiment, and the similarities therebetween will not be redundantly described hereinafter. The difference between the present embodiments and the aforementioned second embodiment is mainly in various arrangements of the concentration modulated regions.

Precisely speaking, in the third embodiment, the high-voltage semiconductor device 400 includes a plurality of concentration modulated regions 421, and each of the concentration modulated regions 421 also includes a square-shaped doped region (having a relative lower doped concentration). Each of the square-shaped doped regions is spaced from each other to in-line arrange in a portion of the buried layer 420 under the first well region 130 or the drain region 150. On the other hand, in the fourth embodiment, the high-voltage semiconductor device 500 simultaneously includes a concentration modulated region 521 and a concentration modulated regions 523. The concentration modulated region 521 and the concentration modulated region 523 are illustrated as a rectangular frame shaped doped region (having a relative lower doped concentration) respectively, in a top view as shown in FIG. 6. The concentration modulated region 521 and the concentration modulated region 523 are separated from each other within a portion of the buried layer 520 under the first well region 130 and the drain region 150, and the concentration modulated region 523 surrounds the concentration modulated region 521. Also, the geometric center of the concentration modulated region 523 may overlap with the geometric center of the concentration modulated region 521, but not limited thereto. In the fifth embodiment, the high-voltage semiconductor device 600 simultaneously includes a plurality of concentration modulated regions 621 and a plurality of concentration modulated regions 623. The concentration modulated regions 621 are stripe-shaped doped regions (having a relative lower doped concentration) which are parallel with each other to extend along a first direction D1, and the concentration modulated regions 623 are stripe-shaped doped regions (having a relative lower doped concentration) which are parallel with each other to extend along a second direction D2, with the second direction D2 being different from the first direction D1. Accordingly, each of the concentration modulated regions 623 may cross the concentration modulated regions 621 in a top view as shown in FIG. 7, so that, the concentration modulated regions 623 and the concentration modulated regions 621 may present a grid-shaped structure within a portion of the buried layer 620 under the first well region 130 and the drain region 150, but not limited thereto. In the fifth embodiment, the first direction D1 is for example perpendicular to the second direction D2, as shown in FIG. 7, but not limited thereto. In another embodiment, the first direction and the second direction may be optionally interleaved with each other but not perpendicular to each other, so that, the concentration modulated regions may also present a grid-shaped structure in an overall manner.

Through each of the above arrangements, the concentration modulated regions (including the concentration modulated regions 421 shown in FIG. 5, the concentration modulated regions 521, 523 shown in FIG. 6, and the concentration modulated regions 621, 623 shown in FIG. 7) may also be further uniformly arranged in the portion with stronger electric field of the high-voltage semiconductor device 400/500/600, so that, the doped concentration of the buried layer (including the buried layer 420 shown in FIG. 5, the buried layer 520 shown in FIG. 6, and the buried layer 620 shown in FIG. 7) under the said portion with stronger electric field may be uniformly reduced, for example being about 10% to 20% reduced, preferably about 15% reduced, in comparison with the doped concentration of other portion of the buried layer, but not limited thereto. In this way, the high-voltage semiconductor device 400/500/600 also improves the lower breakdown voltage issue usually at a portion with stronger electric field intensity therein (for example the portion adjacent to the PN junction or adjacent to the drain region 150), to sufficiently increase the breakdown voltage of the said portion with stronger electric field intensity, for example being about 5 volts increased, but is not limited thereto. Then, the high-voltage semiconductor device 400/500/600 may therefore obtain preferable element performances.

Additionally, it is noted that although the various type of the concentration modulated regions in the aforementioned embodiments are all exemplified by being disposed in a buried layer, people well skilled in the art should easily realize the aforementioned concentration modulated regions may also be formed in other electric insulation layers of a high-voltage semiconductor device optionally, such as being formed in a deep well region or a high-voltage well (HV well) region. In this way, the doped concentration of a portion of the said electric insulation layers may also be reduced by disposing these concentration modulated regions in the portion of the said electric insulation layers, so as to locally reduce the electric field intensity of the high-voltage semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-voltage semiconductor device, comprising:
   a substrate, comprising a first conductive type;
   a buried layer, disposed in the substrate, the buried layer comprising a second conductive type being complementary to the first conductive type;
   a source region, disposed in the substrate and over the buried layer, the source region comprising the first conductive type;
   a drain region, disposed in the substrate and over the buried layer, the drain region comprising the first conductive type;
   a gate, disposed on the substrate, between the source region and the drain region;
   at least one concentration modulated region, disposed in a portion of the buried layer, the at least one concentration modulated region being under the drain region and comprising the second conductive type, wherein a doped concentration of the at least one concentration modulated region is lower than a doped concentration of the buried layer; and
   a first well region, disposed in the substrate, between the drain region and the at least one concentration modulated region, the first well region having the first conductive type, wherein the at least one concentration modulated region only contacts a bottom surface of the first well region and a projection area of the at least one concentration modulated region does not exceed a projection area of the first well region.

2. The high-voltage semiconductor device accordingly to claim 1, wherein the doped concentration of the at least one concentration modulated region is 10% to 20% lower than the doped concentration of the buried layer.

3. The high-voltage semiconductor device accordingly to claim 1, wherein the at least one concentration modulated region comprises at least one stripe-shaped doped region.

4. The high-voltage semiconductor device accordingly to claim 1, wherein the at least one concentration modulated region comprises a plurality of square-shaped doped regions, and the square-shaped doped regions are separately disposed and misaligned with each other.

5. The high-voltage semiconductor device accordingly to claim 1, wherein the at least one concentration modulated region comprises a plurality of square-shaped doped regions, and the square-shaped doped regions are spaced from each other.

6. The high-voltage semiconductor device accordingly to claim 1, wherein the at least one concentration modulated region comprises at least one rectangular frame shaped doped region.

7. The high-voltage semiconductor device accordingly to claim 1, wherein the at least one concentration modulated region comprises a plurality of the concentration modulated regions, the concentration modulated regions comprises a first concentration modulated region being extended along a first direction and a second concentration modulated region being extended along a second direction, and the first direction is different from the second direction.

8. The high-voltage semiconductor device accordingly to claim 1, wherein the drain region is disposed in the first well region.

9. The high-voltage semiconductor device accordingly to claim 8, wherein a coverage area of the at least one concentration modulated region is smaller than a coverage area of the first well region.

10. The high-voltage semiconductor device accordingly to claim 8, wherein the at least one concentration modulated region directly contacts the first well region.

11. The high-voltage semiconductor device accordingly to claim 8, wherein a PN junction is disposed between the buried layer and the first well region.

12. The high-voltage semiconductor device accordingly to claim 8, further comprising:
    a second well region, disposed in the substrate, the second well region comprising the second conductive type, wherein the second well region surrounds the first well region and the source region is disposed in the second well region.

13. The high-voltage semiconductor device accordingly to claim 12, wherein the doped concentration of the buried layer is greater than a doped concentration of the second well region.

14. The high-voltage semiconductor device accordingly to claim 12, wherein one end of the gate partially covers the second well region, and the end of the gate adjacent to the source region.

15. The high-voltage semiconductor device accordingly to claim 12, further comprising:
   a bode region disposed in the second well region and the body region comprising the second conductive type.

16. The high-voltage semiconductor device accordingly to claim 15, the body region surrounds the drain region and the source region.

17. The high-voltage semiconductor device accordingly to claim 15, further comprising:
   a first insulating structure disposed on the substrate, between the body region and the drain region; and
   a second insulating structure disposed on the substrate, between the drain region and the gate, the gate not directly contacting the drain region.

\* \* \* \* \*